United States Patent [19]
Covill

[11] Patent Number: 4,605,910
[45] Date of Patent: Aug. 12, 1986

[54] AM PULSE DURATION MODULATOR

[75] Inventor: Dennis H. Covill, Tantallon, Canada

[73] Assignees: Nautical Electronic Laboratories Limited, Hacketts Cove; Tantallon Halifax Co., Nova Scotia, both of Canada

[21] Appl. No.: 625,694

[22] Filed: Jun. 28, 1984

[51] Int. Cl.[4] .............................................. H03K 7/00
[52] U.S. Cl. ................................ 332/9 R; 307/106; 332/9 T; 363/26; 375/22
[58] Field of Search ............... 307/106; 332/9 R, 9 T; 363/26; 375/22, 58, 60; 455/43

[56] References Cited
U.S. PATENT DOCUMENTS 3,866,146  2/1975  Van Mourik ..................... 332/9 R Primary Examiner—Eugene R. LaRoche
Assistant Examiner—James C. Lee

[57] ABSTRACT

The present invention relates to a circuit for producing a switching modulating signal for switching a pulse duration modulator, so that the pulse duration modulator produces an output signal which is independent of the supply voltage. The circuit is comprised of an amplifier having at least one input port and an output port. The input port is connected to a modulating signal via a first resistor. A multiplier is provided which has first and second input ports and an output port. The first port of the multiplier is connected to the supply voltage, the second input port is connected to the output port of the amplifier, and the output port of the multiplier is connected via a second resistor to at least one input port of the amplifier. The switching modulating signal appears at the output port of the amplifier. This switching modulating signal, when used to switch a pulse duration modulator, provides a signal at the output of the modulator which is independent of the supply voltage.

12 Claims, 3 Drawing Figures

AM PULSE DURATION MODULATOR

The present invention relates to a pulse duration modulator and more particularly, a pulse duration modulator which has an output which is independent of the supply voltage.

Present pulse duration modulators, as for example, the modulator described in U.S. Pat. No. 1,672,215 which issued in 1928 to Raymond Heising provide an efficient method of converting a low power modulating signal into a high power modulating signal. Basically, such modulators use a switch device which switch a power supply ON and OFF to form a pulse train which contains a series of pulses, the width of which contain information content of the original modulating signal. By passing this high power pulse train through a low pass filter the original waveform of the modulating signal may be reconstituted. A high power signal is therefore reproduced which has the same waveform and modulating characteristic as the original signal.

Such a modulator is linear over a wide range and is efficient since it switches the power supply strictly on and off thereby avoiding the IR losses normally inherent in, for example, a class A amplifier.

One major drawback with prior art pulse duration modulation systems is that the output signal is dependent on the supply voltage from which the power signal is derived. Fluctuations in this supply voltage manifest themselves in hum and/or harmonic distortion in the RF power output of the transmitter to which the modulator is connected.

The present invention provides circuitry which produces a driving or switching signal which, when switching the supply voltage S, produces a high power modulating signal which is independent of the supply voltage. If d is defined as the fractional closure time of the switched modulator then $S \times d$ is the average output voltage. The present invention produces a fractional closure signal $d = k/S$ so that when d operates the switching modulator the output is a function of k which is independent of the supply voltage and which is a constant.

As a result, the modulator of the present invention reduces variations in transmitter power output caused by A.C. line variations. Hum modulation of the RF signal is reduced when that hum is caused by an A.C. line ripple on the D.C. supply volts.

Ripple voltage on the D.C. supply voltage which is at the modulating audio frequency will cause harmonic distortion. This audio ripple voltage can occur in practise at low audio frequencies due to the high audio current component of the modulator input current flowing through the source impedance of the D.C. supply. This present invention greatly reduces harmonic distortion at the output of the modulator caused by this effect.

In accordance with one aspect of the invention there is provided a circuit for producing a switching modulating signal from a modulating signal for controlling a pulse duration modulator of the type which switches a supply voltage to produce a modulated signal, said circuit including means to produce the reciprocal of the supply voltage and means to combine the reciprocal of the supply voltage with said modulating signal to produce said switching modulating signal whereby the modulated signal is substantially independent of fluctuations in the supply voltage.

In accordance with another aspect of the invention there is provided a circuit for producing a switching modulating signal for switching a pulse duration modulator, so that the pulse duration modulator produces an output signal which is independent of the supply voltage, said circuit comprising (a) an amplifier means having at least one input port and an output port, said input port being connected to a modulating signal via a first resistor means; (b) a multiplier means having first and second input ports and an output port, wherein said first port of said multiplier means is connected to said supply voltage, said second input port is connected to said output port of said amplifier means, and said output port of said multiplier means is connected via a second resistor means to said at least one input port of said amplifier means, said switching modulating signal appearing at the output port of said amplifying means.

In accordance with another aspect of the invention there is provided a method of providing a high power modulating signal as the output of a pulse duration modulator which is independent of the supply voltage operated on by the pulse duration modulator comprising the step of supplying a driving voltage to the pulse duration modulator which includes a term which is the reciprocal of the supply voltage.

In the drawings which illustrate embodiments of the invention,

Figure 1:
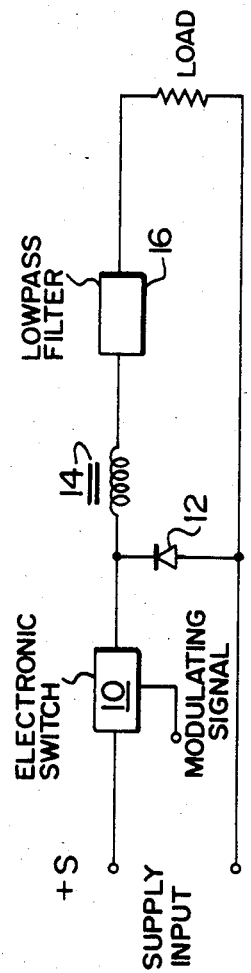
FIG. 1 is a block diagram of a prior art pulse duration modulator.

FIG. 1 shows a prior art pulse duration modulator. A D.C. power supply voltage S is switched either ON or OFF by an electronic switch 10. The output of the electronic switch is therefore a rectangular wave signal train whose pulses have a voltage $+S$, the voltage of the supply. The width or duration of each pulse is dependent on the closure time d which, in turn, is dependent on the frequency or fractional period of the instantaneous signal activating the electronic switch. d can be defined as the closure time divided by the period of the signal.

Diode 12 is a standard freewheel diode and is required to maintain current flow into choke 14 when the electronic switch 10 is open. Lowpass filter 16 filters out the high frequency switching content of the pulse duration modulation signal and produces a high power signal having the same waveform and frequency content as the original modulating signal. The high power modulating signal at the output of lowpass filter 16 can be fed into a load such as a solid state RF power stage for use in an AM transmitter.

The pulse duration modulator shown in FIG. 1 is of high efficiency because the low power modulating signal controls the electronic switch which switches hard ON and OFF thereby eliminating IR losses normally associated with analog forms of amplification. The configuration is very linear in operation and a pure high power modulating signal is produced as long as there is no fluctuation in the supply voltage S.

Since d is the closure time of the electronic switch, the average voltage $V_T$ at the output of the electronic switch 10 can be described as $S \times d$ where S is the supply voltage. The value of d will be a time varying signal and be described as $A/2(1+m \sin wt)$ where A is a utilization constant, m is the desired modulation fraction and w is the angular modulation frequency.

The average output voltage $V_T$ can then be defined as $$V_T = S \times \frac{A}{2} (1 + m \sin wt) \quad (1)$$

Provided S is a constant and does not contain a ripple voltage $V_T$ will be stable and linear.

If S varies, then $V_T$ will vary and if the variation has an audio frequency content or a content which will pass through the lowpass filter 16, distortion will occur.

The problem would disappear if the voltage output of the modulator were made independent of the supply voltage.

The present invention frees the output voltage of the modulator from its dependency on the supply voltage by modifying d the signal controlling the electronic switch. The present invention provides circuitry for producing a closure factor d, where $$d = \frac{A}{2} (1 + m \sin wt) \frac{S_o}{S} \quad (2)$$

where $S_o$ is a constant.

Figure 2:
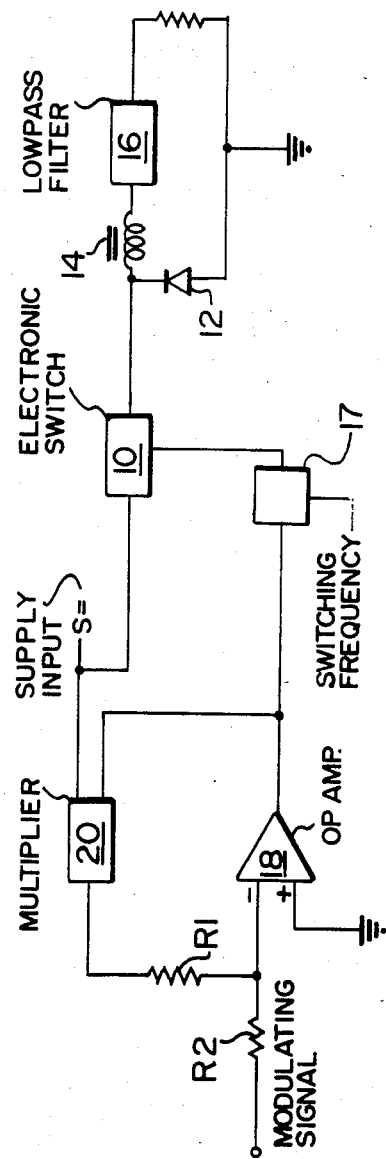
FIG. 2 is a block diagram of an embodiment of a pulse duration modulator in accordance with the present invention.

Reference is now made to FIG. 2 where like elements have the same reference numerals as FIG. 1.

The modulating signal is fed to a high gain operational amplifier 18 via a resistor $R_2$. The output of a multiplier circuit 20 is fed via resistor $R_1$ to the input of amplifier 18.

If the voltage at the output of the amplifier 18 is $V_x$ and the modulating voltage is defined as $A/2(1+m \sin wt)$, then summing the currents at the input to amplifier 18

$$\frac{V_{out}}{R_1} + \frac{1}{R_2} \times \frac{A}{2} (1 + m \sin wt) = 0 \quad (3)$$

where the amplifier has a particular gain and $V_{out}$ is the output voltage of multiplier 20.

However, $V_{out} = SV_x k$ where k is a multiplier constant of the multiplier.

Substituting the value of $V_{out}$ into equation (3) and solving for $V_x$ $$V_x = \frac{A}{2} (1 + m \sin wt) \frac{R_1}{kR_2 S} \quad (4)$$

or $$V_x = \frac{A}{2} (1 + m \sin wt) \frac{S_o}{S}$$

where $$S_o = \frac{R_1}{kR_2} \quad (5)$$

From FIG. 1, $V_T$ the voltage output of the modulator, is $S \times d$. In FIG. 2 the pulse duration modulator 17 has a characteristic such that $d = V_x$ and therefore $$V_T = S \times \frac{A}{2} (1 + m \sin wt) \frac{S_o}{S} \quad (6)$$

-continued
$$V_T = S_o \times \frac{A}{2} (1 + m \sin wt)$$

Equation (6) provides a voltage output at the output of the modulator which is independent of the power supply voltage but is dependent on $S_o$. However, $S_o$ is a constant as is shown in equation (5).

The combination of multiplier 20 and operational amplifier 18 form a divide by circuit which produces a reciprocal of the supply voltage, i.e. $S_o/S$ where $S_o$ is a constant which is dependent on the multiplier factor k and the value of resistors $R_1$ and $R_2$. Pulse duration modulator 17 will be discussed in more detail with reference to FIG. 3.

Figure 3:
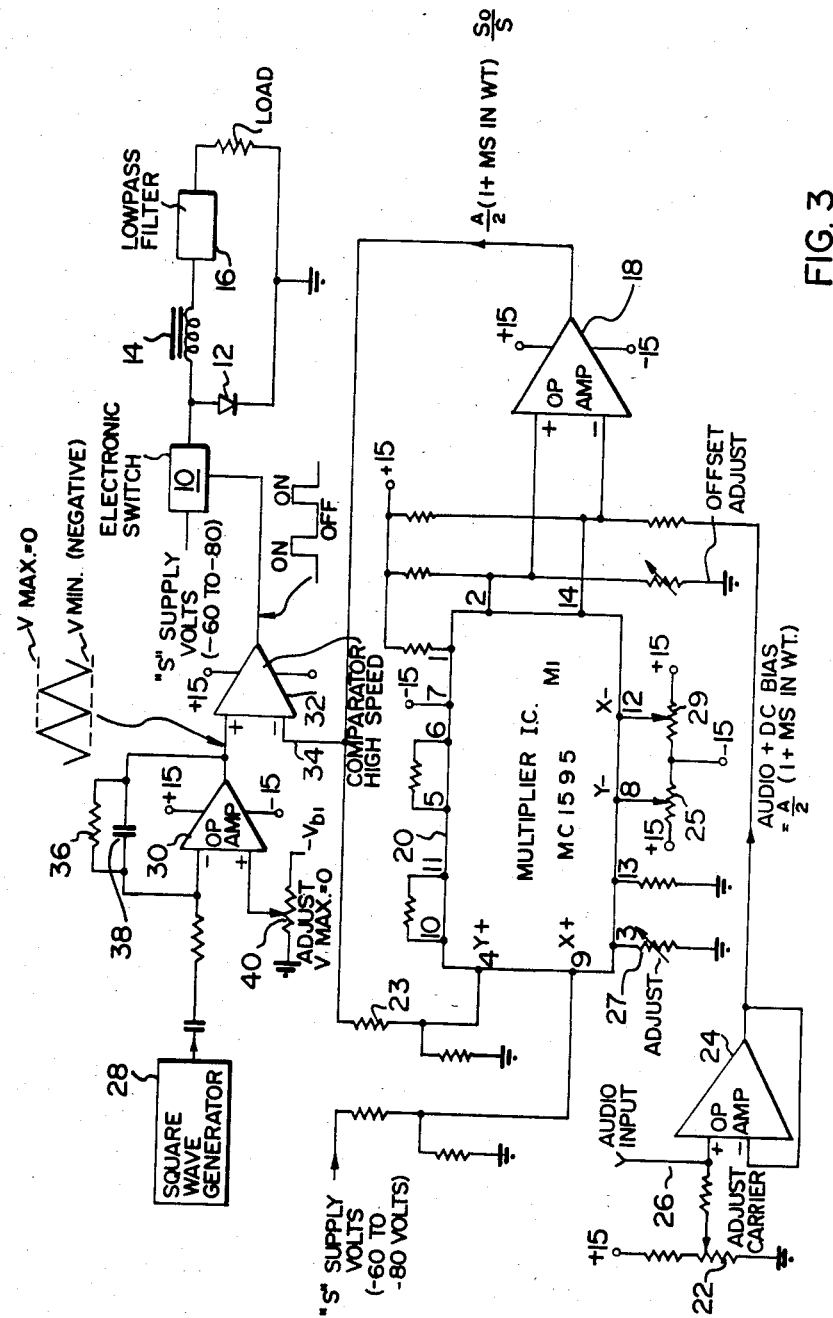
FIG. 3 is a schematic diagram of another embodiment of the present invention.

FIG. 3 is a more detailed implementation of the theory explained using FIG. 2. Once again, like components bear like reference numerals.

It should be understood that when no modulating signal is present the transmitter, to which the present device is connected, produces a constant carrier frequency. This carrier corresponds to the D.C. component of the modulating waveform and may be adjusted using potentiometer 22 which feeds a constant D.C. signal or bias voltage to operational amplifier 24. The modulating signal $A/2(m \sin wt)$ is also fed to amplifier 24 via a coupling capacitor 26. Amplifier 24 acts as a buffer and provides a composite, unipolar modulation signal $A/2(1+m \sin wt)$ at its output. The division function described with reference to FIG. 2 is carried out by multiplier IC chip 20 and operational amplifier 18. The multiplier IC chip 20 can be a MC 1595 by Motorola (trademark). The differential amplifier 18 is used as an offset amplifier so as to interface the multiplier output back to zero volts D.C. reference. One input to the multiplier/amplifier combination is the composite modulating signal consisting of the D.C. bias for setting the carrier and the audio modulating signal. The circuit shown in FIG. 3 is designed to process a negative supply voltage S of between −60 and −80 volts.

This supply voltage is fed to pin 9 of multiplier 20. The output of operational amplifier 18 is fed to multiplier 20 at pin 4 via a resister 23. The value of k, the multiplier constant, can be adjusted via potentiometer 27 attached to pin 3. Pins 8 and 12 of the multiplier 20 are connected to potentiometers 25 and 29, respectively. The DC offset voltages feeding pins 8 and 12 are adjusted so that the multiplier 20 operates correctly within the dynamic range needed.

The desired corrected composite modulating signal $$\frac{A}{2} (1 + m \sin wt) \times -\frac{S_o}{S}$$

is fed to a comparator 32 via line 34.

A square wave generator 28 provides a square wave frequency of approximately 70 KHz. The frequency is not critical but should be at least five times that of the highest frequency of the modulating signal. Operational amplifier 30 in conjunction with resistor 36 and capacitor 38 provide an integration circuit. Square wave generator 28 feeds this integration circuit so that a triangular waveform having a frequency of approximately 70 KHz appears on the output of operational amplifier 30. A negative voltage from potentiometer 40 is connected to the plus input of the amplifier 30 and is adjusted so that the maximum voltage of the triangular wave at the output of amplifier 30 is zero volts. Comparator 32 produces either a high logic level voltage or zero volts depending on the instanteous relationship between its two input signals. As a result, its output is a train of rectangular pulses. The duration of the positive going pulses contains the information of the corrected composite modulating signal. Square wave generator 28, operational amplifier 30 and comparator 32 along with their associated circuitry form the pulse duration modulator block 17 shown in FIG. 2.

The output of comparator 32 feeds a standard high power modulator as was described with reference to FIG. 1. In the configuration shown in FIG. 3 the circuit is designed to handle a negative supply voltage and so the polarity of the freewheel diode 12 is reversed. The signal which operates the electronic switch 10 is a composite pulse duration modulating signal. It is composite in that it contains a signal which provides both the carrier and the modulating signal. In addition, the output of the high power modulator is compensated in that it is not a function of the supply voltage.

The operational amplifiers 18, 24 and 30 shown in FIG. 3 can be TL081 operational amplifiers supplied by Texas Instruments (trade mark).

The circuit configuration shown in FIGS. 2 and 3 is merely one way of obtaining the result required, namely the provision of a reciprocal circuit which provides a composite corrected modulating signal which when used in conjunction with a high power pulse duration modulator which uses a D.C. supply voltage as a source of power, produces a modulated signal which is substantially independent of fluctuations in the supply voltage. The circuitry described in FIGS. 2 and 3 is not meant in any way to limit the scope of the invention.

I claim:

1. A circuit for producing a switching modulating signal from a modulating signal for controlling a pulse duration modulator of the type which switches a supply voltage to produce a modulated signal, said circuit including means to produce the reciprocal of the supply voltage and means to combine the reciprocal of the supply voltage with said modulating signal to produce said switching modulating signal whereby the modulated signal is substantially independent of fluctuations in the supply voltage.

2. A circuit for producing a switching modulating signal for switching a pulse duration modulator, so that the pulse duration modulator produces an output signal which is independent of the supply voltage, said circuit comprising:
   (a) an amplifier means having at least one input port and an output port, said input port being connected to a modulating signal via a first resistor means;
   (b) a multiplier means having first and second input ports and an output port, wherein said first port of said multiplier means is connected to said supply voltage, said second input port is connected to said output port of said amplifier means, and said output port of said multiplier means is connected via a second resistor means to said at least one input port of said amplifier means, said switching modulating signal appearing at the output port of said amplifying means.

3. The circuit of claim 2 wherein said amplifying means is an operational amplifier.

4. The circuit of claim 3 wherein the output signal is of the form $A/2(1+m \sin wt) \times S_o$ where $S_o$ and A are constants, m is the desired modulation percentage and w is the angular frequency of the modulating frequency.

5. The circuit of claim 4 wherein the switching modulating signal is in the form $A/2(1+m \sin wt) S_o/S$ where S is the supply voltage.

6. The circuit according to claim 5 wherein $S_o = R_1/kR_2$ where $R_1$ is the resistance of the first resistor means, $R_2$ is the resistance of the second resistor means and k is a constant determined by the multiplier means.

7. A voltage supply independent pulse duration modulator comprising:
   (a) electronic switch means having a supply voltage input port, a control signal input port and a high power signal output port, said output port being connected to ground via the serial connection of an inductance means, lowpass filter means and a load, a diode being connected between said output port and ground;
   (b) comparator means having first and second input ports and an output port, said output port connected to said control signal input port of said electronic switch means;
   (c) square wave generator means;
   (d) integrator means having an input port connected to the square wave generator means and an output port connected to the first input port of said comparator means; and
   (e) reciprocal circuit means comprising:
      (i) differential amplifier means having an output port connected to said second input port of said comparator means and first and second input ports, said first input port being connected via a first resistor means to a source of modulating signal; and
      (ii) multiplier means having first and second input ports and an output port, said first input port being connected to said supply voltage, said second input port being connected via a second resistor means to the output port of said differential amplifier means and said output port being connected to the second input port of said differential amplifier means, wherein said high power signal output is independent of said supply voltage.

8. The modulator of claim 7 wherein buffer means are connected between said source of modulating signal and said first input port of said differential amplifier means.

9. The modulator of claim 8, wherein the signal at said high power signal output port is of the form $$\frac{A}{2}(1 + m \sin wt) \times S_o$$

where $S_o$ and A are constants, m is the desired modulation percentage and w is the angular frequency of the modulating signal.

10. The modulator of claim 9, wherein the signal appearing at the output port of the differential amplifier means is of the form $$\frac{A}{2}(1 + m \sin wt) \times \frac{-S}{S_o},$$

where $-S$ is the supply voltage.

11. The modulator of claim 10 wherein $$S_o = \frac{R_1}{kR_2},$$

where $R_1$ is the resistance of said first resistor, $R_2$ is the resistance of the second resistor and k is a constant determined by said multiplier means.

12. The modulator according to claim 11 wherein the frequency of said square wave generator is approximately 70 KHz.

* * * * *